United States Patent [19]
Aekins

[11] Patent Number: 6,057,743
[45] Date of Patent: May 2, 2000

[54] DISTRIBUTED NOISE REDUCTION CIRCUITS IN TELECOMMUNICATION SYSTEM CONNECTOR

[75] Inventor: Robert A. Aekins, Stratford, Conn.

[73] Assignee: Hubbell Incorporation, Orange, Conn.

[21] Appl. No.: 09/102,037

[22] Filed: Jun. 22, 1998

[51] Int. Cl.[7] ........................................... H01R 9/09
[52] U.S. Cl. ................................................ 333/1; 439/941
[58] Field of Search ..................... 439/941, 55; 333/1, 333/12, 5; 379/417

[56] References Cited

U.S. PATENT DOCUMENTS

| | | |
|---|---|---|
| 442,856 | 12/1890 | Carty . |
| 5,299,956 | 4/1994 | Brownell et al. .................. 439/638 |
| 5,414,393 | 5/1995 | Rose et al. ............................ 333/1 |
| 5,432,484 | 7/1995 | Klas et al. ............................ 333/1 |
| 5,618,185 | 4/1997 | Aekins ............................... 439/76.1 |
| 5,673,009 | 9/1997 | Klas et al. ............................ 333/1 |
| 5,700,167 | 12/1997 | Pharney et al. ..................... 439/676 |

*Primary Examiner*—Neil Abrams
*Assistant Examiner*—Hae Moon Hyeon
*Attorney, Agent, or Firm*—Jerry M. Presson; Mark S. Bicks; Alfred N. Goodman

[57] ABSTRACT

A connector for telecommunication systems has input terminals and output terminals arranged in ordered arrays and connected by a circuit having a plurality of conductive paths connecting the respective input and output terminals. The circuit cancels crosstalk induced across adjacent connected terminals by sets of sections. Two of the paths have one set of sections connected in series and spaced from each other between the input and output terminals. Another pair of paths have another set of sections connected in series and spaced from each other between the input and output terminals. Each section of the two sets forms a noise reduction circuit providing a reactive coupling between the respective paths which is greater than adjacent portions of the paths spacing the sections of the two sets.

23 Claims, 3 Drawing Sheets

DISTRIBUTED NOISE REDUCTION CIRCUITS IN TELECOMMUNICATION SYSTEM CONNECTOR

REFERENCE TO RELATED APPLICATION

This application is related to U.S. patent application Ser. No. 08/795,394, filed in the name of Robert A. Aekins and entitled LOW CROSSTALK NOISE CONNECTOR FOR TELECOMMUNICATION SYSTEMS, and U.S. Pat. No. 5,618,185 to Aekins, entitled CROSSTALK NOISE REDUCTION CONNECTOR FOR TELECOMMUNICATION SYSTEM, the subject matter of each is hereby incorporated by reference.

FIELD OF THE INVENTION

The present invention relates to connectors for telecommunication systems in which crosstalk induced between adjacent terminals of the connectors is canceled. More particularly, the present invention relates to connectors with plural pairs of input and output terminals connected by conductive paths having serially spaced, distributed noise reduction circuit sections to cancel the effects of induced crosstalk.

BACKGROUND OF THE INVENTION

The wide acceptance of four pair unshielded twisted pairs (UTP) wire systems for data and voice transmission is due to the large installed base Electronic Industry Association (EIA) category 5 media local area network (LAN) systems. Demands on networks using four pair UTP systems, such as transmission rates, have increased, forcing development of industry standards for higher system performance than the EIA Commercial Building Telecommunication Wiring Standards 568A Category 5. The EIA 568A category 5 level performance defines electrical parameters for proper data signal systems that require up to 100 Megahertz (MHz) frequency bandwidth, i.e., fast Ethernet 100 Base-T. The latest data rates have increase up to 1000 mega-bits per second, 1000 Mbps (1000 Base-T Ethernet), that allow LAN systems to transfer data 10 times faster than 100 Base-T Ethernet on UTP media cabling. Because of the predicted sensitivity levels of transmitting up to 1000 Mbps, the EIA Commercial Building Telecommunication Wiring group has considered the implication of higher category levels for system electrical performance.

The EIA higher categories for cabling electrical performance will increase from level 5 to 5e (enhanced) and eventually to level 6. The electrical performance parameters, such as NEXT (near end crosstalk) and Return Loss and Attenuation, must be substantially lower than present EIA category 5 requirements. The highest bandwidth for the categories will probably increase from 1-100 MHz for category 5 to 1-200 MHz or more for category 6. For cabling systems to meet the anticipated higher electrical performance requirements, better cabling than standard EIA category 5 will be needed.

For any data transmission event, the received signal will comprise the transmission signal modified by various distortions. The various distortions are added by the transmission system, along with additional unwanted signals inserted somewhere between transmission and reception. The major unwanted signal, NEXT noise, has been one of the main issues in high speed cabling systems. NEXT noise is the major limiting factor in today's communication systems performance. Problems that arise from noise are data errors, system malfunctions and loss of the actual wanted signals. NEXT or crosstalk noise occurs when signal energy from one source is coupled to another victim line.

When one transmission pair (pair 1) is next to another pair (pair 3), crosstalk coupling can occur. The fields are either capacitively (electric), or inductively (magnetic) coupled, or both from pair 1 to pair 3.

Crosstalk in a communication system can be minimized by decreasing the signal's power, increasing the distance between signal lines, providing shielding between signal lines, and twisting the wire of a pair.

An RJ45 plug with EIA 568A T56BB wiring layout has an array of eight pins in order. Pins 4 and 5 provide the tip and ring pins of the first pair. Pins 1 and 2 provide the tip and ring pins of the second pair. Pins 3 and 6 provide the tip and ring pins of the third pair. Pins 7 and 8 provide the tip and ring pins of the fourth pair.

Crosstalk using the RJ45 plug will increase as the speeds or system transmission frequencies increase. Crosstalk generated in the cable is minimized by the transposition (twisting) of the transmitting pairs of wires. However, as the signal travels through untwisted sections, such as plugs and plug contacts, coupling occurs. In a differential balance two wire per pair transmission system, the signals that travel along each wire (media) of a pair are equal in amplitude but opposite in phase. The phase difference of the two signals is $\pm n$ radian or voltage $+1(E1)=-\text{voltage}-1(E2)$ under ideal conditions. These signals, at any instantaneous time, couple electric and/or magnetic fields to adjacent lines which reduces their signal to noise ratio (S/N). The acceptable S/N ratio depends on the type or quality of service that is required by the system. To remove the noise components, a signal equal but opposite to the original signal is induced. According to Fourier's wave theory and Maxwell's theory of electromagnetic fields, coupling the opposite phase of the transmitted signal to a previously coupled adjacent line signal, the two signals cancel each other completely and therefore removes the noise from the adjacent line.

In the four pair connecting hardware system, multiple pairs are provided for data signal transmission. The worse case NEXT noise that a RJ45 plug creates is a balance coupled noise, meaning the noise is coupled equally upon the adjacent pairs. For an EIA T568B RJ45 plug, the worse case noise is typically between pairs 1 and 3, pins 4 and 5, and pins 3 and 6, respectively.

Previous low noise EIA category 5 connector designs used one section signal compensation systems which are good for category 4 and 5 cabling systems, but probably will not provide category 6 electrical performance. Additional reduction of the unwanted NEXT noises, created by the patch cord and cables, to a lower level that might be required for category 6 rated channel performance.

SUMMARY OF THE INVENTION

An object of the present invention is to provide a connector for communication systems which will effectively reduce crosstalk and improve system signal to noise ratios.

Another object of the present invention is to provide a connector with reduced crosstalk without shielding and without changing the standard connector geometry and pinout definitions.

A further object of the present invention is to provide a connector with reduced crosstalk which is simple and inexpensive to manufacture and use.

The foregoing objects are basically obtained by a connector for communications systems, comprising first, second, third and fourth input terminals arranged in a first ordered array with the second and third input terminals between the first and fourth input terminals, first, second, third and fourth output terminals arranged in a second ordered array, and a circuit electrically coupling each of the input terminals to the respective output terminal and canceling crosstalk induced across the adjacent connector terminals. The circuit includes first, second, third and fourth conductive paths between the respective input and output terminals. The first and third paths have a first set of sections connected in series and spaced from each other between the input and output terminals. The second and fourth paths have a second set of sections connected in series and spaced from each other between the input and output terminals. Each section of the first and second sets forms a noise reduction circuit providing a reactive coupling connected between the respective paths thereof which is greater than adjacent portions of the paths spacing the sections of the sets.

By forming the connector in this manner, the crosstalk noise is reduced without requiring new equipment and wiring. The connector will reduce crosstalk noise effectively regardless of whether the induced crosstalk results from magnetic (inductive) coupling or electric (capacitive) coupling, or from a combination of both couplings since multiple sections of noise reduction circuits decrease crosstalk noise to a greater extend than a corresponding single section of a noise reduction circuit.

This multiple technique provides a more controlled product than other crosstalk reduction designs, which greatly improves design time, efficiency and cost. This technique also decreases the reactance of the compensation circuit, permits a wide frequency coupling range, and provides a better balance compensation circuitry.

Other objects, advantages and salient features of the present invention will become apparent from the following more detailed description, which, taken in conjunction with the annexed drawings, discloses a preferred embodiment of the invention.

BRIEF DESCRIPTION OF THE DRAWINGS

Referring to the drawings which form a part of this disclosure.

DETAILED DESCRIPTION OF THE INVENTION

Figure 1:
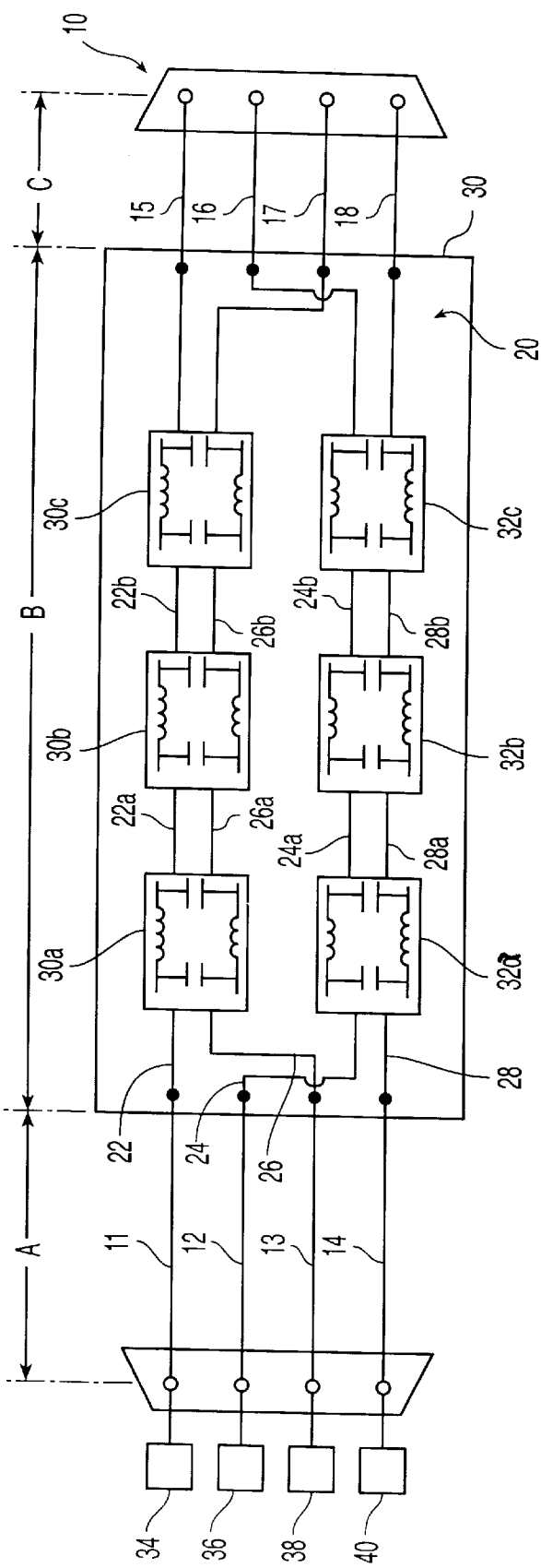
FIG. 1 is a block diagram graphically illustrating a communication connector and its input\output components according to the present invention.

A connector 10 according to the present invention is schematically or diagrammatically illustrated in FIG. 1, with the connector divided into an input section A, a circuit section B and an output section C. The circuit section electrically couples the connector input terminals 11, 12, 13 and 14 to the output terminals 15, 16, 17 and 18, respectively, such that crosstalk induced across adjacent terminals in input section A and output section C is canceled in circuit section B.

The input and output terminals are of conventional designs used in telephone and other communications systems for such connectors as jacks, patch panels and cross connects. The conventional details of the connector in input section A and output section C are not described in detail.

The circuit section B comprises a printed wiring board 20 with four printed circuit traces or conductive paths 22, 24, 26 and 28 printed on a substrate 30. Trace 22 extends between and connects input terminal 11 and output terminal 15. Trace 24 extends between and connects input terminal 12 and output terminal 16. Trace 26 extends between and connects input terminal 13 and output terminal 17. Trace 28 extends between and connects input terminal 14 and output terminal 18.

In circuit board 20, traces 22 and 26 are arranged in a first set of sections 30a, 30b and 30c for inducing crosstalk therebetween. Traces 24 and 28 are arranged in a second set of sections 32a, 32b and 32c for inducing crosstalk therebetween. Traces 22 and 26 are substantially spaced from traces 24 and 28 to minimize induced crosstalk between such two pairs in circuit board 20.

In input section A and output section C, the proximity of adjacent terminals induces crosstalk between the adjacent terminals. Specifically, crosstalk is induced in terminal 11 from terminal 12, in terminal 12 from terminals 11 and 13, in terminal 13 from terminals 12 and 14, in terminal 14 from terminals from terminal 13, in terminal 15 from terminal 16, in terminal 16 from terminals 15 and 17, in terminal 17 from terminals 16 and 18, and in terminal 18 from terminal 17. The spacing between the terminals is adequate to minimize crosstalk between the other or non-adjacent terminal pairs.

In a communications system, terminals 11, 12, 13 and 14 are connected to signal sources 34, 36, 38 and 40, respectively. The signals from sources 34 and 40 are equal and opposite (i.e., differently driven or of opposite phase) to each other. The signals from sources 36 and 38 are equal and opposite to each other. With the application of these two pairs of opposite or differently driven signals, the crosstalk induced in printed wiring board 20 in circuit section B tends to cancel the crosstalk induced across and between the respective input and output terminals in the input and output sections A and B of the connector.

The arrangement length, separation, thickness and width of traces 22, 26, 28 and 30 in sections 30a–c and 32a–c, and the dielectric constant of the printed wiring board can be adjusted. With appropriate adjustment of those factors, the crosstalk signals induced between traces 22 and 26 and between traces 24 and 28 in the sections can be controlled to cancel, at least approximately, the effects of the induced signals or crosstalk resulting from the proximity of the terminals in input section A and output section C. The factors can also be adjusted to compensate for wiring crosstalk.

Connector 10 is bi-directional. Thus, signal sources can be coupled to the output terminals instead of the input terminals.

Each section of the first set of sections 30a–c and of the second set of sections 32a–c forms a noise reduction circuit. The noise reduction circuits of each set are connected in series and spaced from each other between the respective input and output terminals, and provides a reactive coupling between the respective conductive paths which is greater than the adjacent portions 22a–b, 24a–b, 26a–b and 26a–b spacing the sections of each set.

Adjacent both the input terminals 11–14 and the output terminals 15–18, second conductive path 24 and third conductive path 26 cross each other. The crossover areas are between the respective terminals and the sections 30a–c and 32a–c forming the noise reduction circuits. This crossover allows conductive paths 22 and 26 to be reactively coupled and the conductive-paths 24 and 28 to be reactively coupled.

The noise reduction circuits of each set are cascaded from a high compensation circuitry to a low compensation circuitry in a direction from input terminals 11–14 to output terminals 15–18. The first noise reduction circuit 30a or 32a of each set compensates for approximately 60 percent of the crosstalk noise in those paths. The second noise reduction circuit 30b or 32b of each set compensates for approximately 30 percent of the crosstalk noise in the respective conductive paths. The third noise reduction circuit 30c or 32c of each set compensates for approximately 10 percent of the crosstalk noise in the respective conductive paths. The total percentage reduction of crosstalk noise in each set should equal 100 percent. In this manner, each noise reduction circuit captures and removes only a portion of the noise signal. The spacing of the noise reduction circuits of each set provided by conductive path portions 22a–b, 26a–b, 24a–b and 28a–b are sufficient that each noise reduction circuit captures and filters a different portion of the coupled noise signal wave.

The reactive couplings, as graphically illustrated in FIG. 1, are both capacitive and inductive.

FIGS. 2–5 illustrate an example of the present invention formed by a multi-layered printed wiring board. Each layer of the printed wiring board comprises a dielectric substrate having conductive paths and conductors printed thereon.

Figure 5:
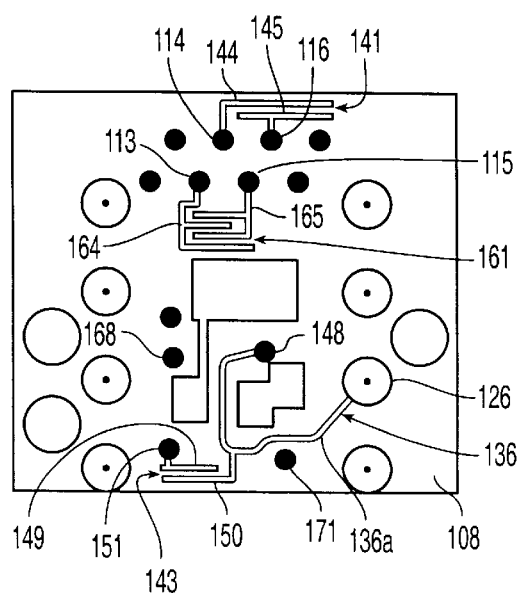

The board is formed by substrate layer 102 (FIG. 2), substrate layer 104 (FIG. 3), substrate layer 106 (FIG. 4) and substrate layer 108 (FIG. 5). Each layer has input terminal connections 111–118 and output terminal connections 121–128 which are electrically connected to the contacts or terminals. Terminal connections 111 and 121 are connected by conductive path 131 on layer 104. Terminal connections 112 and 122 are connected by conductive path 132 on layer 102. Terminal connections 113 and 123 are connected by conductive path 133 on layer 102. Terminal connections 114 and 124 are connected by conductive path 134 on layer 104. Terminal connections 115 and 125 are connected by conductive path 135 on layers 104 and 106. Terminal connections 116 and 126 are connected by conductive path 136 on layers 102 and 108. Terminal connections 117 and 127 are connected by conductive path 137 on layer 104. Terminal connections 118 and 128 are connected by conductive path 138 on layer 106.

The first input terminal pair is coupled to terminal connections 114 and 115. The third input terminal pair is coupled to input terminal connections 113 and 116. Terminal connections 114 and 113 are for the tip terminals. Terminal connections 116 and 115 are for the ring terminals.

Conductive paths 134 and 136 include a first set of sections forming a first distributed noise reduction circuit section 141 on layer 108, a second distributed noise reduction circuit section 142 on layer 104 and a third distributed noise reduction circuit section 143 on layer 108 to couple conductive paths 134 and 136 capacitively and inductively. First distributed noise reduction circuit section 141 is provided by coplanar parallel conductors 144 and 145 extending from leads coupled directly to terminal connections 114 and 116, respectively, on layer 108.

Second distributed noise reduction circuit section 142 is formed by conductors 146 and 147. Conductor 146 extends from an intermediate portion of conductive path 134 on layer 104. Conductive path 147 extends from a connection 148 on layer 104, and is substantially parallel to and coplanar with conductor 146. Conductor 147 is coupled by connection 148, extending through each of the four layers, to conductive path 136. Connection 148 also couples conductive path portions 136b to 136a to form conductive path 136.

The third distributed noise reduction section 143 is formed by conductors 149 and 150. Conductor 149 extends from a connection 151. Connection 151 extends through each of the layers to electrically couple conductor 149 to conductive path 134. Conductor 150 extends directly from an intermediary portion of the portion 136a of conductive path 136 located between output terminal connection 126 and connection 148.

The second set of distributed noise reduction sections capacitively and inductively couple conductive paths 133 and 135, and is formed by a first distributed noise reduction section 161, a second distributed noise reduction section 162 and a third distributed noise reduction section 163. The second set first noise distributed section comprises an arrangement of conductors 164 extending from terminal connection 113 and an arrangement of conductors 165 extending from terminal connection 115 on layer 108. Each of the arrangements of conductors 164 and 165 comprise a conductor extending directly from a terminal connection and then conductors extending transversely from that conductor to form interleaving or overlapping conductors forming the distributed noise reduction circuit sections.

The second distributed noise reduction section 162 of the second set is provided by conductors 166 and 167 which extend in a parallel and coplanar manner on layer 104. Conductor 166 is connected to a connection 168. Connection 168 extends through each of the layers to couple conductor 166 to conductive path 133. Conductor 167 extends from connection 169. Connection 169 extends through each of the layers to connect the two portions 135a and 135b of conductive path 135 and to couple conductor 167 to conductive path 135.

The third distributed noise reduction section 163 of the second set is formed by a conductor 170 and an adjacent portion of conductive path 133 near output terminal connection 123. Conductor 170 extends from a connection 171. Connection 171 extends through each of the layers and is connected by a conductor 172 on layer 106 to a portion 135b on layer 106.

As can be readily seen in the illustrations of FIGS. 2–5, the conductors forming each of the six distributed noise reduction circuit sections are significantly closer to each other than the remaining portions of the conductive paths coupling the input and output terminal connections and coupling and spacing the respective noise reduction circuit sections of the respective sets. This insures that the reactive coupling in each such section is greater than the adjacent portions of the conductive paths.

By using the following formula $$0.7DNRC = 0.6DNRCn + 0.3DNRCn + 0.1DNRCn,$$

the total needed circuit coupling reactance is met by the summation of DNRC without using one large circuit reactance. The 0.6DNRC factor of each first section is larger because it is needed to quickly offset the input RJ45 plug which creates a high negative noise factor (est. 7). The remaining noise that is not removed by 6DNRC is further reduced by 0.3DNRC factor of each second section which cuts the negative noise factor down to 0.1. The last 0.1DNRC factor of each third section removes the remaining negative noise factors to practically <0.1.

Estimated number of DNRC=1 per 60 MHz or nDNRC est=1 per 60 MHz.

Figure 6:
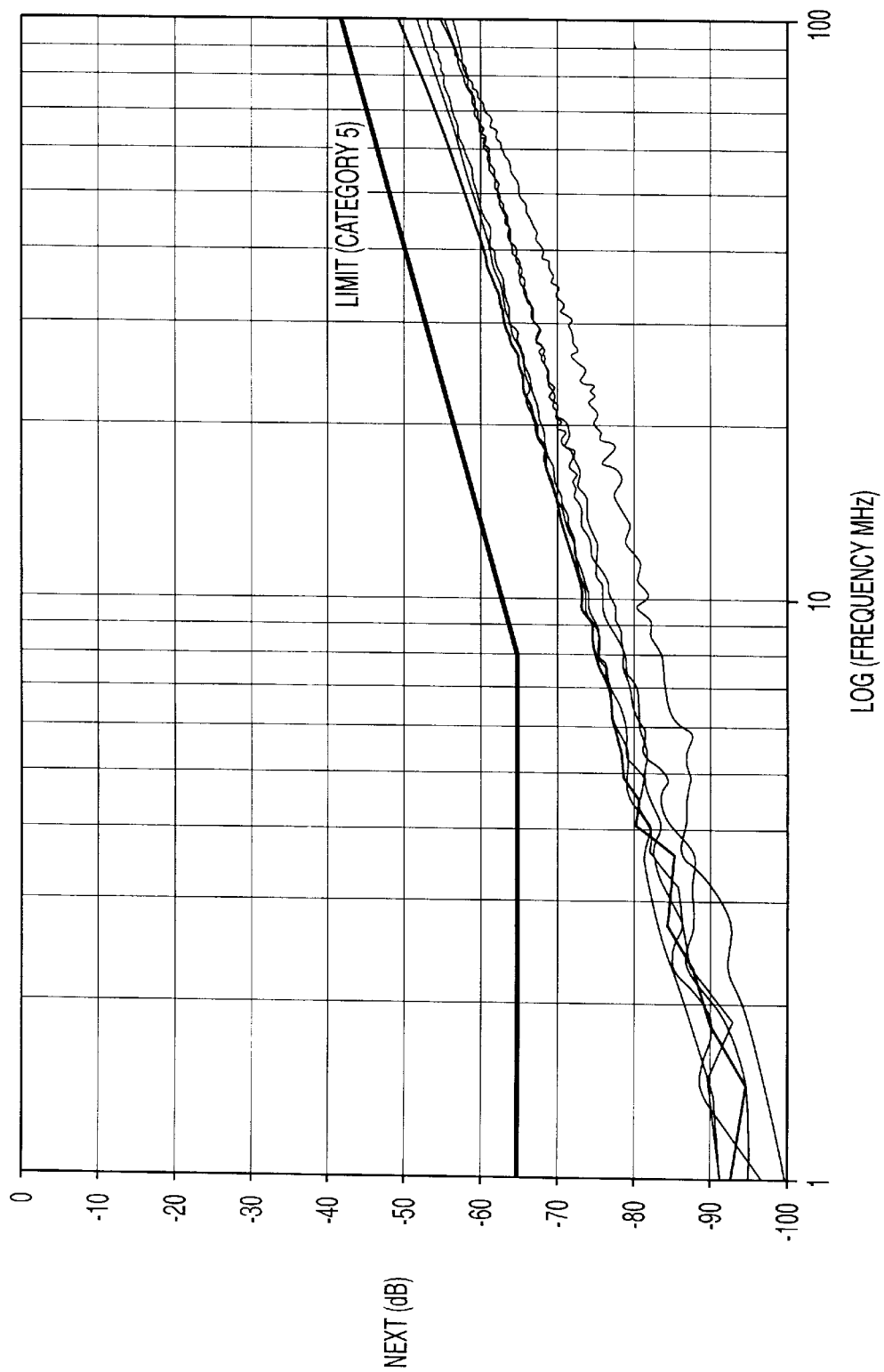
FIG. 6 is a graph illustrating the performance of a connector according to the present invention shown in a different layout.

FIG. 6 shows the near-end crosstalk (NEXT) of a RJ45 to 1101DC connecting hardware that incorporates the design of the present invention. All 6 combination pairs (1–2, 1–3, 1–4, 2–3, 2–4, 3–4) of the RJ45 to 1101DC connecting hardware are shown to be significantly below the EIA category 5 pass/fail limit line. A typical EIA category 5 RJ45 plug to 1101DC connecting hardware will provide a worse case NEXT of −42–45 dB at 100 MHz.

Figure 7:
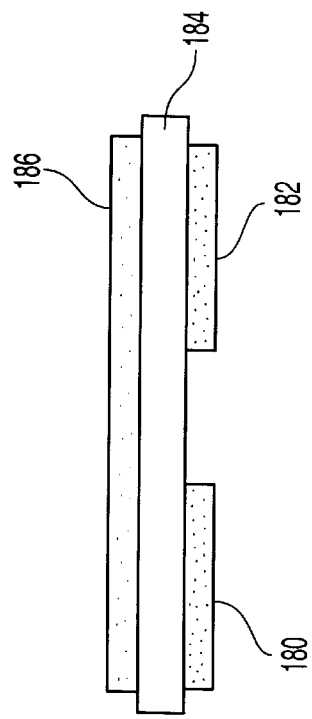
FIG. 7 is a side elevational view graphically illustrating a printed circuit board with an additional feature which can be incorporated into the present invention.
Figure 2:
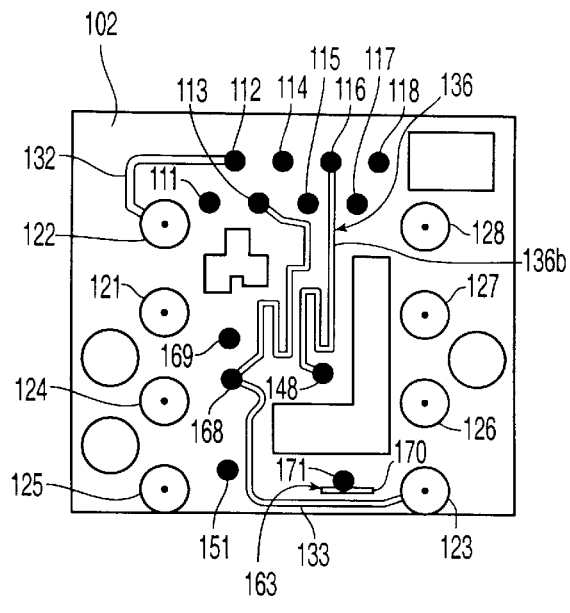
FIGS. 2, 3, 4, and 5 are plan views of different layers of a printed circuit board for a connector according to the present invention.
Figure 3:
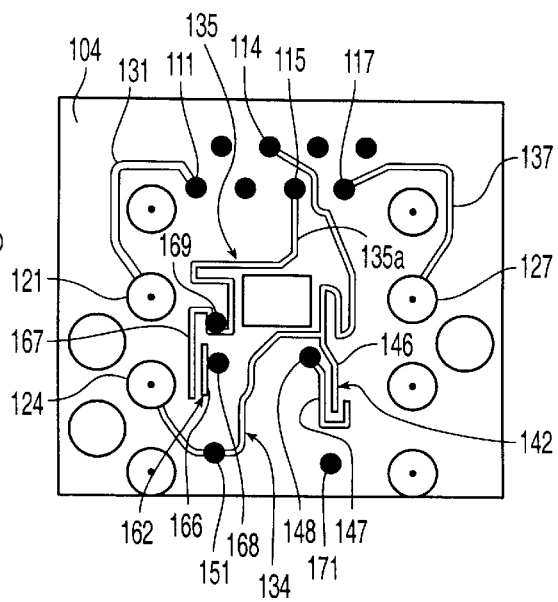
Figure 4:
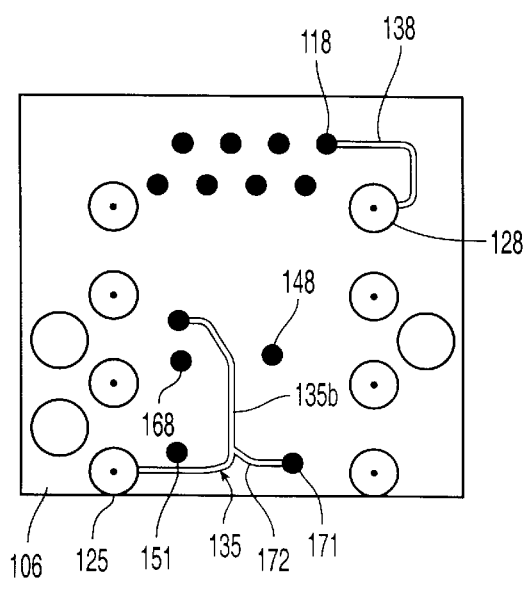

FIG. 7 depicts a floating plane design which can be incorporated with the distributed noise reduction circuit sections. In this arrangement, the tip conductive paths 180 and the ring conductive paths 182 are located on one side of the dielectric circuit board 184. A floating plane 186 is located on the opposite surface of the dielectric circuit board. This floating plane further enhances the electrical performance of the present invention.

While a particular embodiment has been chosen to illustrate the invention, it will be understood by those skilled in the art that various changes and modifications can be made therein without departing from the scope of the invention as defined in the appended claims.

What is claimed is:

1. A connector for communications systems, comprising:

first, second, third and fourth input terminals arranged in a first ordered array with said second and third input terminals being between said first and fourth input terminals;

first, second, third and fourth output terminals arranged in a second ordered array; and a circuit electrically coupling said first, second, third and fourth input terminals to said first, second, third and fourth output terminals, respectively, and for canceling crosstalk induced across adjacent ones of said terminals, said circuit including first, second, third and fourth conductive paths between said first, second, third and fourth terminals, respectively, said first and third paths having a first set of sections connected in series and spaced from each other between said input terminals and said output terminals by a first set of adjacent portions of said first and third paths, said second and fourth paths having a second set of sections connected in series and spaced from each other between said input terminals and said output terminals by a second set of adjacent portions of said second and fourth paths, each section of said first and second sets forming a noise reduction circuit, each said noise reduction circuit providing a reactive coupling having a reactance between the respective conductive paths thereof, said reactance of each said noise reductive circuit being greater than reactances of the respective adjacent portions of said conductive paths spacing said sections of each of said sets.

2. A connector according to claim 1 wherein said second and third paths cross each other between said input terminals and said sets of said sections.

3. A connector according to claim 1 wherein said noise reduction circuits of each of said sets are cascaded from high compensation circuitry to low compensation circuitry in a direction from said input terminals to said output terminals.

4. A connector according to claim 1 wherein each of said sets comprises first, second and third noise reduction circuits in order from said input terminals to said output terminals, said first noise reduction circuit of each said set compensating for approximately sixty percent of crosstalk therein, said second noise reduction circuit of each said set compensating for approximately thirty percent of crosstalk therein, said third noise reduction circuit of each said set compensating for approximately ten percent of crosstalk therein.

5. A connector according to claim 1 wherein said first and fourth input terminals are respectively coupled to sources of equal and opposite signals.

6. A connector according to claim 5 wherein said second and third input terminals are coupled to sources of equal and opposite signals.

7. A connector according to claim 1 wherein said circuit comprises a printed wiring board with a dielectric substrate having conductors printed thereon.

8. A connector according to claim 7 wherein said printed wiring board comprises a plurality of layers.

9. A connector according to claim 1 wherein said sections of said conductive paths forming each of said reactive couplings are parallel.

10. A connector according to claim 1 wherein said sections of said conductive paths forming each of said reactive couplings are parallel and coplanar.

11. A connector according to claim 1 wherein said conductive paths are located on different planes.

12. A connector according to claim 1 wherein said reactive couplings are capacitive couplings.

13. A connector according to claim 1 wherein said reactive couplings are inductive couplings.

14. A connector for communications systems, comprising:

first, second, third and fourth input terminals arranged in a first ordered array;

first, second, third and fourth output terminals arranged in a second ordered array; and a printed wiring board coupling said first, second, third and fourth input terminals to said first, second, third and fourth output terminals, respectively, said board including a dielectric substrate having first, second, third and fourth conductive paths printed thereon and extending between said first, second, third and fourth terminals, respectively, said first and third conductive paths having a first set of sections connected in series and spaced from each other on said substrate between said input terminals and said output terminals by a first set of adjacent portions of said first and third paths, said second and fourth paths having a second set of sections connected in series and spaced from each other on said substrate between said input terminals and said output terminals by a second set of adjacent portions of said second and fourth paths, each said section of said first and second sets forming a noise reduction circuit, each said noise reduction circuit providing a reactive coupling having a reactance between the respective conductive paths thereof, said reactance of each said noise reduction circuit being greater than reactances of the respective adjacent portions of said conductive paths spacing said sections of each of said sets;

said conductive paths having lengths and widths and being relatively spaced on said substrate, and said substrate having a dielectric constant such that any induced crosstalk is approximately cancelled.

15. A connector according to claim 14 wherein
said second and third paths cross each other between said input terminals and said sets of said sections.

16. A connector according to claim 14 wherein
said noise reduction circuit of each of said sets are cascaded from high compensation circuitry to low compensation circuitry in a direction from said input terminals to said output terminals.

17. A connector according to claim 14 wherein
each of said sets comprises first, second and third noise reduction circuits in order from said input terminals to said output terminals, said first noise reduction circuit of each said set compensating for approximately sixty percent of crosstalk therein, said second noise reduction circuit of each said set compensating for approximately thirty percent of crosstalk therein, said third noise reduction circuit of each said set compensating for approximately ten percent of crosstalk therein.

18. A connector according to claim 14 wherein
said first and fourth input terminals are respectively coupled to sources of equal and opposite signals.

19. A connector according to claim 18 wherein
said second and third input terminals are coupled to sources of equal and opposite signals.

20. A connector according to claim 14 wherein
said sections of said conductive paths forming each of said reactive couplings are parallel and coplanar.

21. A connector according to claim 14 wherein
said conductive paths are located on different planes.

22. A connector according to claim 14 wherein
said reactive couplings are capacitive couplings.

23. A connector according to claim 14 wherein
said reactive couplings are inductive couplings.

\* \* \* \* \*